United States Patent
Kawaguchi et al.

(10) Patent No.: US 7,633,983 B2
(45) Date of Patent: Dec. 15, 2009

(54) SEMICONDUCTOR LASER DEVICE

(75) Inventors: Yoshinobu Kawaguchi, Mihara (JP); Takeshi Kamikawa, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 2 days.

(21) Appl. No.: 12/010,028

(22) Filed: Jan. 18, 2008

(65) Prior Publication Data

US 2008/0144687 A1   Jun. 19, 2008

(30) Foreign Application Priority Data

Jan. 26, 2007   (JP)   ............................. 2007-016529

(51) Int. Cl.
*H01S 5/00* (2006.01)
*H01S 3/08* (2006.01)

(52) U.S. Cl. ...................... 372/49.01; 372/99
(58) Field of Classification Search ............. 372/49.01, 372/99

See application file for complete search history.

(56) References Cited

U.S. PATENT DOCUMENTS

| | | | |
|---|---|---|---|
| 5,841,584 A | 11/1998 | Takatani et al. | |
| 6,891,201 B2 | 5/2005 | Tsuda et al. | |
| 2002/0021727 A1 | 2/2002 | Yokouchi et al. | |
| 2002/0024981 A1 | 2/2002 | Tojo et al. | |
| 2004/0105473 A1 | 6/2004 | Tojo et al. | |

FOREIGN PATENT DOCUMENTS

| | | |
|---|---|---|
| JP | 08-298351 A | 11/1996 |
| JP | 2000-200938 A | 8/2000 |
| JP | 2002-26442 | 1/2002 |
| JP | 2002-237659 | 8/2002 |
| JP | 2002-335053 A | 11/2002 |
| JP | 2005-045128 A | 2/2005 |
| JP | 2005-340625 A | 12/2005 |

*Primary Examiner*—Armando Rodriguez
(74) *Attorney, Agent, or Firm*—Harness, Dickey & Pierce, P.L.C.

(57) ABSTRACT

A semiconductor laser device includes a coating film for adjustment in reflectance formed at a light-emitting portion of semiconductor, wherein the coating film has a thickness d set to satisfy $R(d, n) > R(d, n+0.01)$ and $d > \lambda/n$, where n represents a refraction index of the coating film for a lasing wavelength $\lambda$, and $R(d, n)$ represents a reflectance at the light-emitting portion depending on the thickness d and the refraction index n.

5 Claims, 5 Drawing Sheets

SEMICONDUCTOR LASER DEVICE

This nonprovisional application is based on Japanese Patent Application No. 2007-016529 filed with the Japan Patent Office on Jan. 26, 2007, the entire contents of which are hereby incorporated by reference.

BACKGROUND OF THE INVENTION

1. Field of the Invention

The present invention relates to a semiconductor laser device and particularly to a semiconductor laser device that can suppress increase in electric current during driving thereof in a long term.

2. Description of the Background Art

A semiconductor laser device is utilized as a light source for reading and/or writing signals from and/or on an optical storage medium such as a compact disk (CD), a digital versatile disk (DVD), or a blue ray disk. For reliability required of the semiconductor laser device, consideration is given to the device's lifetime that is determined from increase in driving-current of the device on condition of a constant optical output.

A bluish violet semiconductor laser device made of nitride and placed on the market in recent years has a shorter lifetime as compared to a conventional semiconductor laser device for emitting infrared or red light for the CD or the DVD and thus it is necessary to extend its lifetime in the future. Furthermore, it is also desirable that the semiconductor laser device for emitting infrared or red light is further improved in its lifetime with increase in its output.

In order to improve the lifetime of the semiconductor laser device, it is generally necessary to reduce crystal defects in the semiconductor, and in the past, the device's lifetime has been improved with advance of crystal growth technology (refer to Japanese Patent Laying-Open No. 2002-237659, for example).

However, the advance of crystal growth technology is saturating, and improvement of the device's lifetime by reduction of the crystal defects is now no longer expected.

SUMMARY OF THE INVENTION

Accordingly, an object of the present invention is to provide a semiconductor laser device having a lifetime improved by other technology than crystal growth technology.

According to the present invention, a semiconductor laser device includes a coating film for adjustment in reflectance at a light-emitting portion of semiconductor, wherein the coating film has a thickness set to satisfy R (d, n)>R (d, n+0.01) and d>$\lambda$/n, where n represents a refraction index of the coating film for a lasing wavelength $\lambda$, and R (d, n) represents a reflectance at the light-emitting portion depending on the thickness d and the refraction index n.

The coating film can be formed with one of oxide, nitride and oxynitride. More specifically, it can be formed with one of $SiO_2$, $Al_2O_3$, and $AlO_xN_y$. Furthermore, an additional $AlO_xN_y$ layer may be interposed between the coating film and the semiconductor. The semiconductor laser device can be formed using nitride semiconductor, and the lasing wavelength $\lambda$ can be set in a range of 390 nm to 470 nm.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The present inventors recognized through an observation with a transmission electron microscope (TEM) that a coating film deposited on a light-emitting end face of a cavity in a nitride semiconductor laser device having a lasing wavelength of 405 nm was altered in its property with time when the laser device is driven. It was considered that such alteration of the coating film was probably caused by photochemical reaction or thermal change due to the laser light.

Then, the present inventors considered a possibility that the alteration of the coating film results in refraction index change of its material. The present inventors further considered a possibility that a coating film having a thickness set as appropriate reduces reflectance at the end face of the cavity with time to thereby increase SE and then can suppress increase in driving-current of the laser device. Note that SE is an abbreviation for slope efficiency and means an increase rate of emission intensity with respect to increment of injection current of a laser device. In other words, it corresponds to slope of an I-L characteristic curve in a graph having a horizontal axis representing current I and a vertical axis representing optical output L.

To confirm whether the present inventors' finding and consideration as described above is correct, aging tests were conducted on a plurality of nitride semiconductor laser devices (samples (1) and (2)) that were different from each other only in thickness of their light-emitting side coating films. The ageing tests were conducted under conditions of pulsed driving (a width of 30 ns and a duty ratio of 50%) and generation of a constant optical output of 210 mW. Then, the light-emitting side coating films were formed of $Al_2O_3$ and have an initial refraction index of 1.680 for the lasing wavelength of 405 nm. Furthermore, the light-emitting side coating films of samples (1) and (2) were 80.3 nm and 281.3 nm in thickness, respectively, and both have a reflectance of 5.6%.

Figure 3:
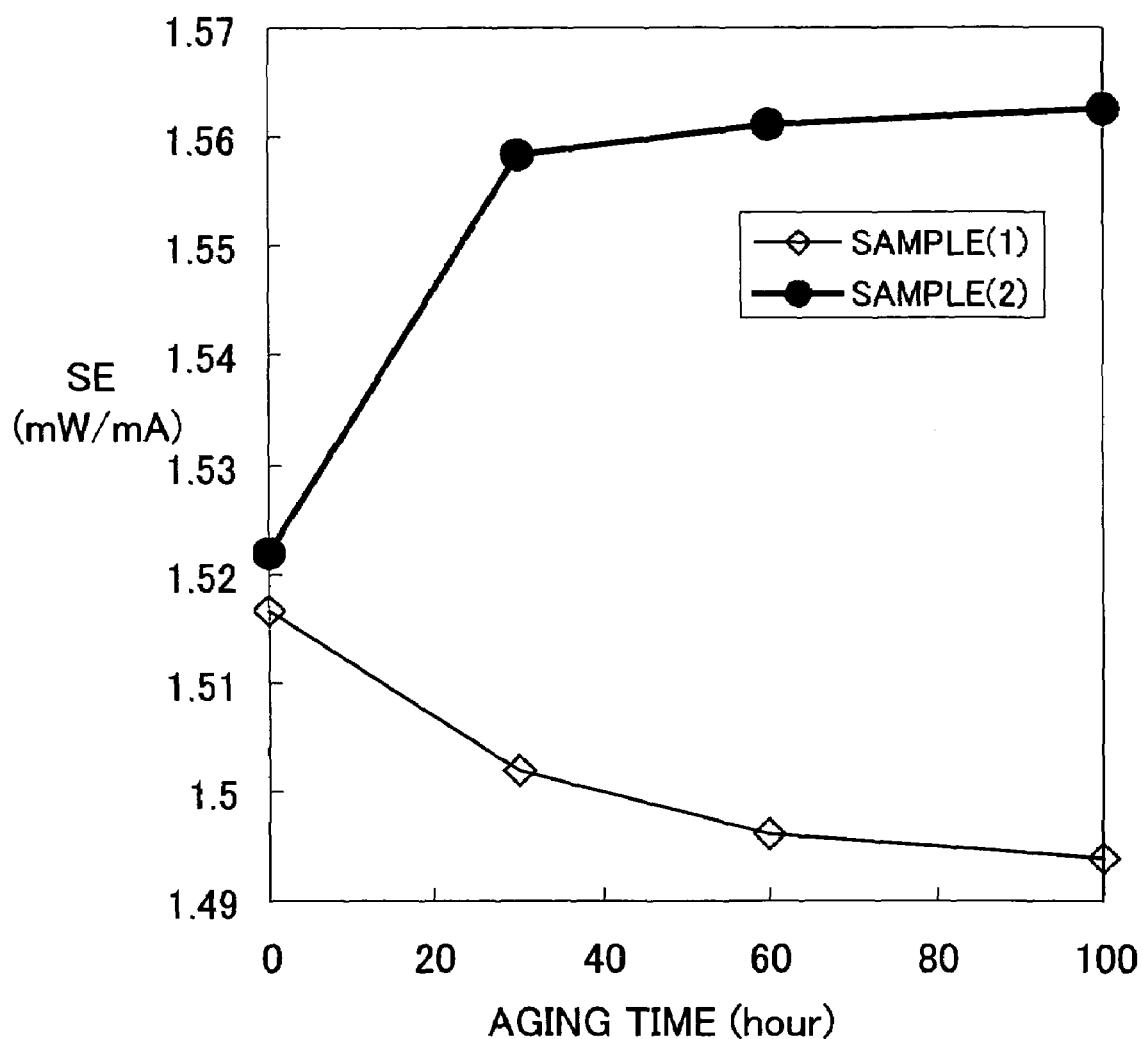
FIG. 3 is a graph showing variations in slope efficiency (SE) of semiconductor laser devices during aging tests.

FIG. 3 shows variations of SE during the aging tests, where a horizontal axis represents the aging time (in hours) and a vertical axis represents the SE (mW/mA). In this graph, sample (1) gradually decreases in SE, whereas sample (2) gradually increases in SE. Here, since both the samples showed approximately the same increase in their threshold currents, it is considered that alteration not in their active layers of semiconductor but mainly in their end face coating films caused the variations in SE.

Figure 4:
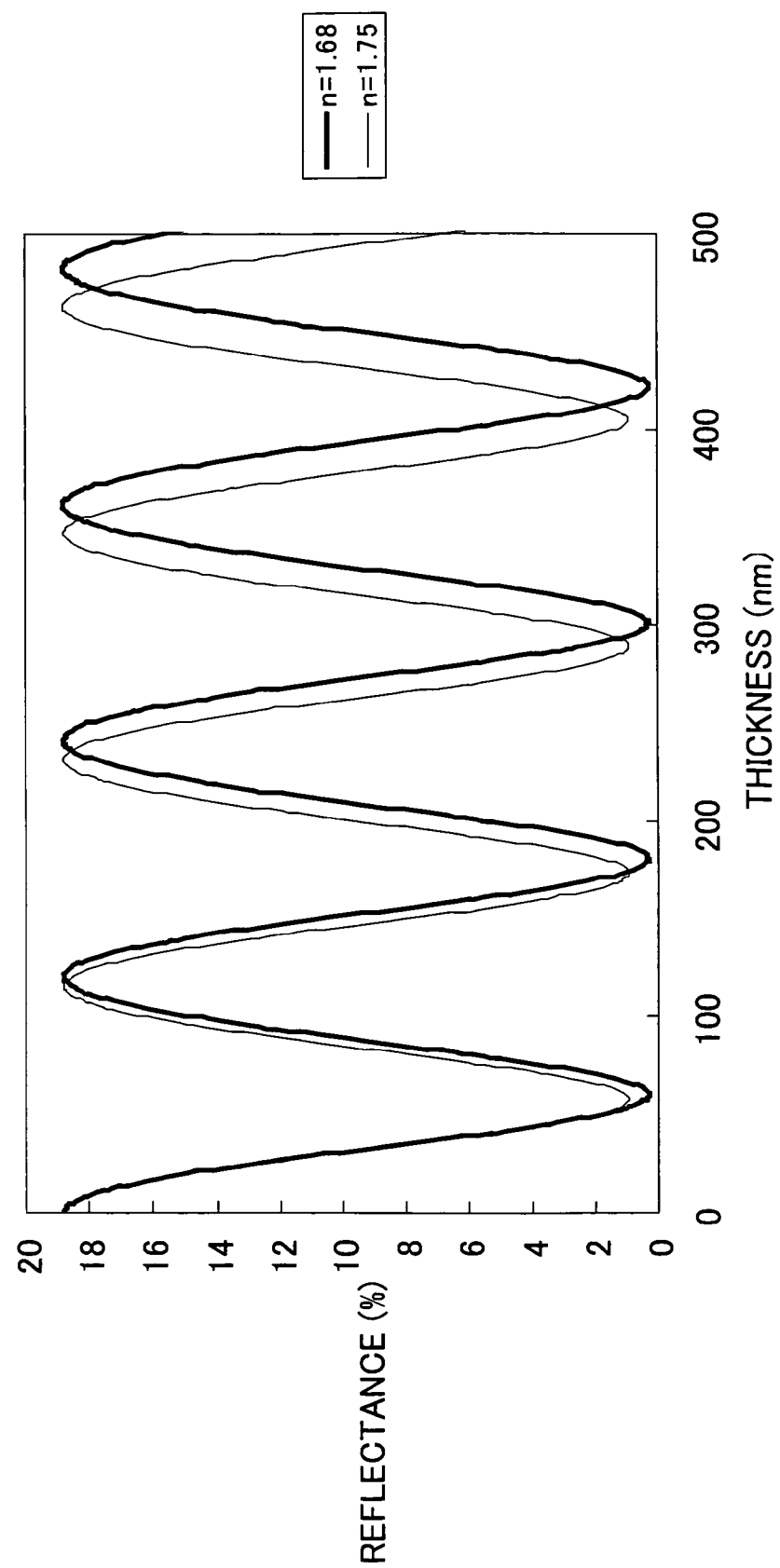
FIG. 4 is a graph showing relationships between reflectance and thickness in $Al_2O_3$ films each used as a coating film on a light-emitting end face of a semiconductor laser device.

FIG. 4 is a graph showing relationships between thickness and reflectance in $Al_2O_3$ films each used as a light-emitting side coating film in the aging test as described above. In this graph, a horizontal axis represents the film thickness (nm) and a vertical axis represents the reflectance (%). Furthermore, in this graph, a thick solid line represents an $Al_2O_3$ film having a refraction index n of 1.68 and a thin solid line represents an $Al_2O_3$ film having a refraction index n of 1.75.

From the FIG. 4 graph, it can be seen that when the $Al_2O_3$ film varies in thickness or refraction index, it varies in reflectance, and SE will also vary accordingly. Since it cannot be considered that the $Al_2O_3$ film increase or decrease in thickness during the aging test, it is considered that the variation of SE in FIG. 3, i.e., variation of reflectance is caused by variation of refraction index. Accordingly, if it is assumed that the $Al_2O_3$ film increases in refraction index during the aging, then, as can be seen from FIG. 4, sample (1) having the film thickness of 80.3 nm will increase in reflectance, and in contrast, sample (2) having the film thickness of 281.3 nm will decrease in reflectance. This can account for the variations in SE as shown in FIG. 3.

Here, it is not clear the reason why the refraction index increases. As described previously, however, the TEM observation revealed that the end face coating film after the aging test was altered in its property as compared with that before the test. Therefore, it is considered that the refraction index increase of the end face coating film during the aging test is not a phenomenon that can never occur.

Figure 5:
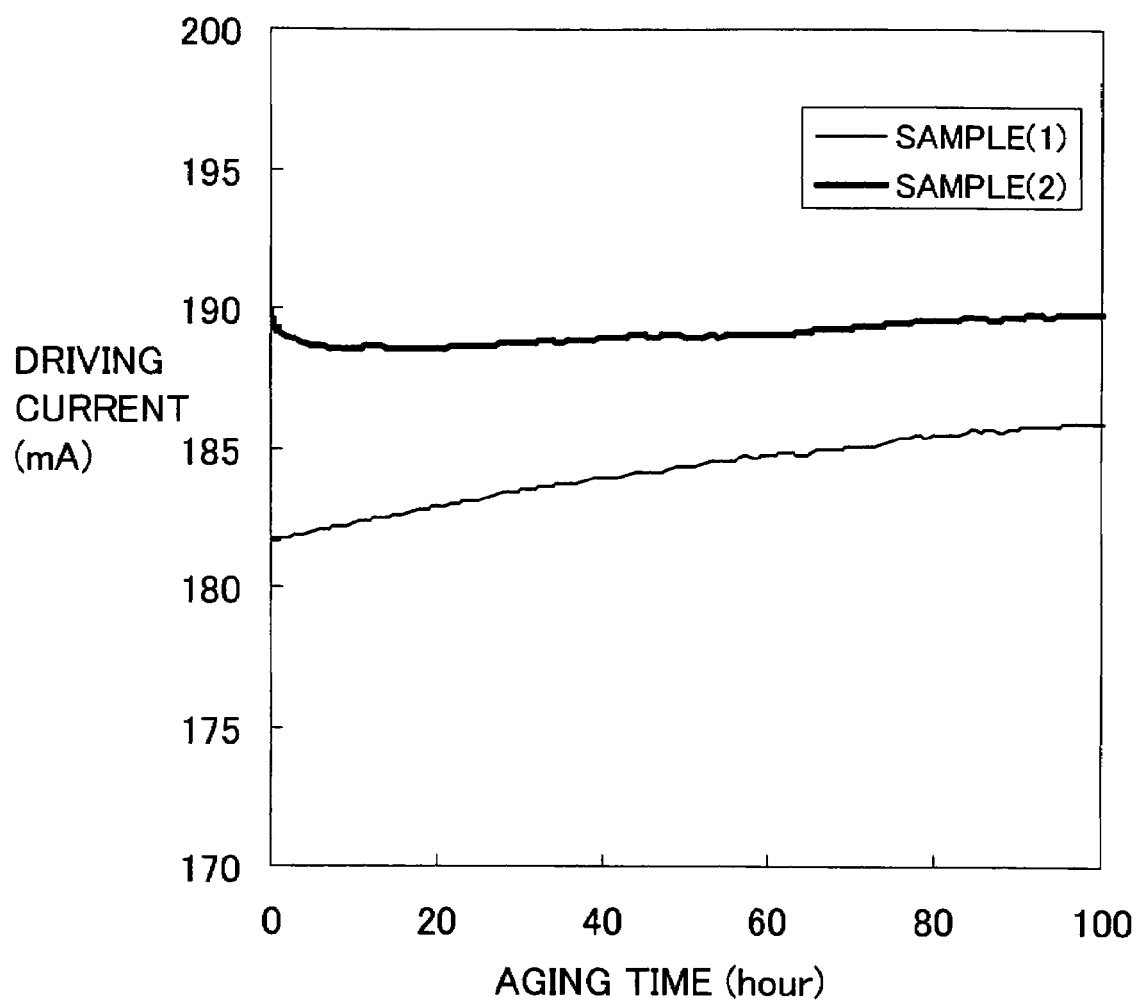
FIG. 5 is a graph showing variations in driving-current of semiconductor laser devices during aging tests.

FIG. 5 is a graph showing variations in driving-current of semiconductor laser devices during aging tests. In this graph, a horizontal axis represents the aging time (hours) and a vertical axis represents the driving-current (mA). Furthermore, in this graph, a thin line curve represents sample (1) and a thick line curve represents sample (2).

In the FIG. 5 graph, it can be seen that the driving-current of sample (2) has a smaller increase rate than that of sample (1). Here, an expected time period (expected lifetime) after which the driving-current increases by 1.3 times as compared to the initial driving-current is estimated from the variation rate of the driving-current for the aging time between time points at 10 hours and 100 hours. As a result, sample (1) has an expected lifetime of 1,362 hours, while sample (2) has an expected lifetime of 4,334 hours that is longer by 3.18 times as compared to sample (1). This is considered to result from the variation in SE caused by the variation in reflectance of the light-emitting side coating film, as described previously.

More specifically, although the threshold current of the laser device increases with decrease in reflectance of the light-emitting side coating film, the driving-current is more influenced by SE than by the threshold current in the case of the optical output being higher. It is deduced from this reason that increase in the driving-current is suppressed and the lifetime is improved as in the case of sample (2) in FIG. 5.

To verify this, the following calculation is performed. More specifically, the SE is calculated assuming an internal loss $\alpha i=15$ cm$^{-1}$ (wave guiding loss per unit length of the cavity) and an internal quantum efficiency $\eta i=0.81$, and also using a front face reflectance of 5.6% and a rear face reflectance of 95.0% of each of samples (1) and (2) as actually measured before the aging tests, the cavity length L=600 μm and the lasing wavelength λ=405 nm. The calculated SE value is 1.52, which well matches the actually measured value in FIG. 3.

In FIG. 3, after the aging for 100 hours, sample (1) has an SE of approximately 1.49 and sample (2) has an SE of approximately 1.56. Accordingly, it is considered that the front face reflectance is 6.3% for sample (1) and 4.5% for sample (2) after the aging. By using the initial refraction index n of 1.680 (actually measured) for the end face coating film of $Al_2O_3$, it can be obtained from the front face reflectance of 5.6% before the aging tests that the film thickness d is 80.3 nm for sample (1) and 281.3 nm for sample (2). Since it can be assumed that these thickness values is maintained even after the aging, it can be obtained that the refraction index n is 1.705 for sample (1) and 1.710 for sample (2) after the aging for 100 hours.

These values are then used to determine variations in threshold current of the laser devices. By assuming a gain parameter of 15 cm/kA and using a ridged stripe width W of 1.5 μm (actually measured) of each laser device, it can be obtained that variation ΔIth in threshold current is −0.59 mA for sample (1) and +1.09 mA for sample (2). When these results and the influence of variation in SE are combined, it can finally be obtained that variation ΔIop in driving-current for the optical output of 210 mW is +1.73 mA for sample (1) and −2.75 mA for sample (2).

Actual ΔIop determined from FIG. 5 is +3.61 mA for sample (1) and +1.18 mA for sample (2), which are different from the calculated values. This is probably because the calculation does not take it into account that the active layers of the actual samples are deteriorated by the aging tests. However, the actual values and the calculated values have the same tendency that ΔIop is smaller in sample (2) than in sample (1), which can account for that the device's lifetime can be improved by selecting an appropriate thickness for the light-emitting side coating film in consideration of increase in refraction index of the film during the aging.

Explanation is now given for the thickness desirable for the light-emitting side coating film in the semiconductor laser device according to the present invention. If the reflectance at the light-emitting portion is represented by R (d, n), where d denotes the thickness of the coating film and n denotes the refraction index for a lasing wavelength λ, then the device's lifetime is improved with increase in SE during the aging on condition of satisfying R (d, n)>R (d, n+α), where α denotes an increment in refraction index. In the above-described aging tests, α is 0.025 for sample (1), while α is 0.030 for sample (2) in which case the improvement of the lifetime is recognized. As a matter of fact, if only the light-emitting side coating film increases in reflectance when it increases in refraction index, the semiconductor laser device increases in SE. Assuming α=0.01, therefore, d is only required to satisfy R (d, n)>R (d, n+0.01).

In the case of thickness d being small, however, the decrement in reflectance is small when the refraction index increases as seen from FIG. 4, and then sufficient improvement of the device's lifetime cannot be expected. Therefore, it is desirable that thickness d is set to be large. More specifically, if d>λ/n, the variation rate of reflectance becomes large, and then it becomes possible to achieve sufficient improvement of the device's lifetime. From the above, it is required in the present invention that thickness d of the light-emitting side coating film satisfies the conditions of R(d, n)>R(d, n+0.01) and d>λ/n.

The material of the light-emitting side coating film may be any of oxide, nitride and oxynitride. More specifically, while occurrence of increase in refraction index of the $Al_2O_3$ coating film has been described in the above, it has also experimentally been confirmed that not only $Al_2O_3$ but also $SiO_2$ and AlON exhibits a similar phenomenon. Furthermore, even in the case of interposing an $AlO_xN_y$ layer between the semiconductor and the $Al_2O_3$ coating film, the similar phenomenon can be caused and then improvement of the device's lifetime can be achieved. In other words, the present invention's effect can also be achieved even in the case that the $AlO_xN_y$ layer is interposed between the light-emitting side coating film and the semiconductor. Since the present invention utilizes the phenomenon that the light-emitting side coating film varies in refraction index during driving of the laser device, as long as this phenomenon occurs, the present invention is basically not limited by the coating film's material, structure, or the like.

With respect to emission wavelength, it was able to confirm the present invention's effect in nitride semiconductor laser devices in a range from the shortest wavelength of 390 nm to the longest wavelength of 470 nm. In other words, since the present invention utilizes the phenomenon that the light-emitting side coating film varies in refraction index during driving of the laser device, as long as this phenomenon occurs, the present invention is basically not limited with respect to lasing wavelength and is also applicable to semiconductor laser devices in a wavelength range including infrared, red, ultraviolet and the like.

Hereinafter, an embodiment of the present invention will be described more specifically. Incidentally, in the drawings, the same reference numbers denote the same portions or corresponding portions. However, it should be noted in the drawings that the dimensional relationship between length, thickness and others is changed as appropriate for the purpose of clarifying and simplifying the drawings and does not correspond to the actual dimensional relationship.

Figure 1:
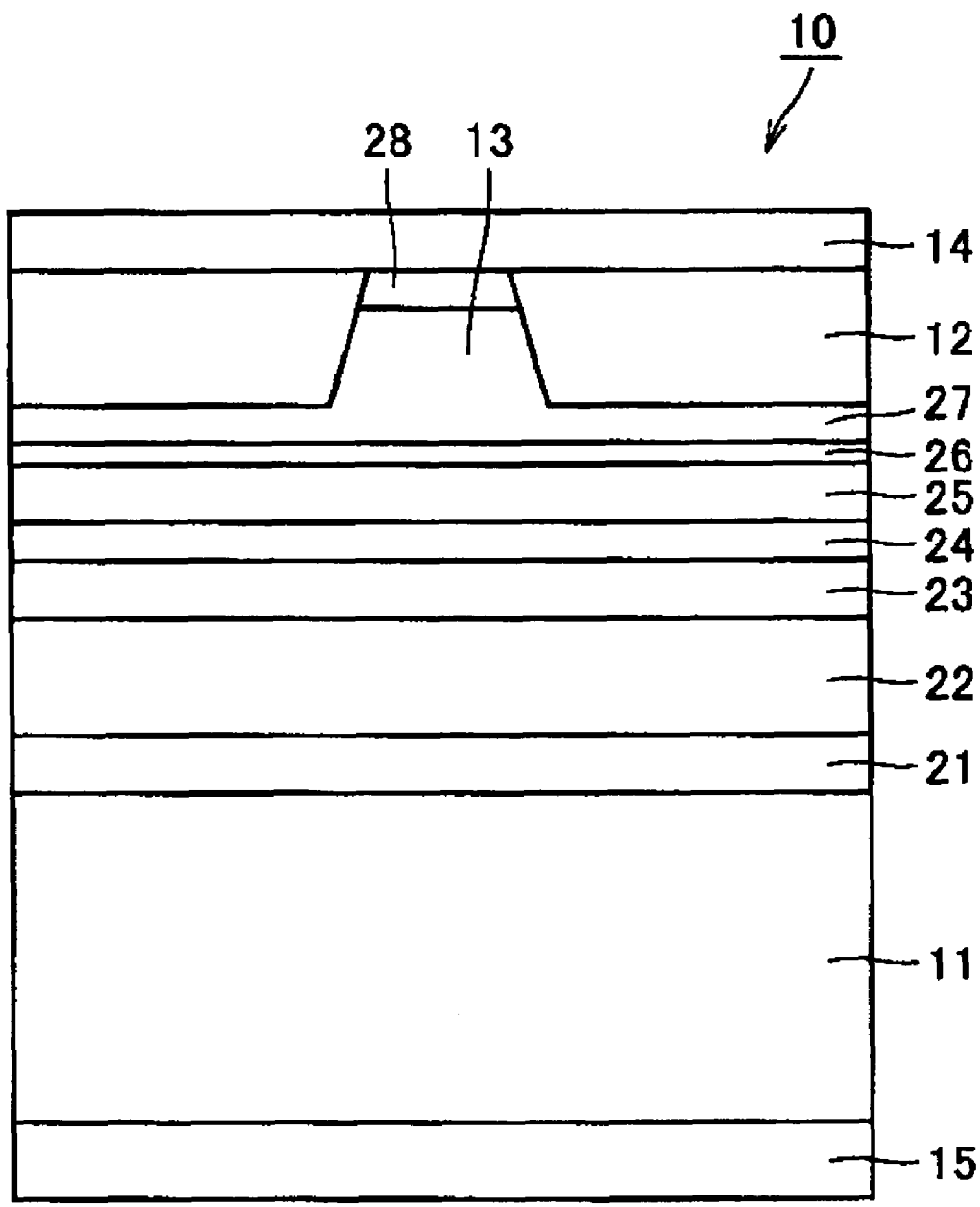
FIG. 1 is a schematic cross section of a multilayer structure of a semiconductor laser device in an embodiment of the present invention.

FIG. 1 is a schematic cross section of a semiconductor laser device according to an embodiment of the present invention. In this semiconductor laser device 10, successively stacked on an n-type GaN semiconductor substrate 11 are an n-type GaN buffer layer 21 of 0.2 μm thickness, an n-type $Al_{0.06}Ga_{0.94}N$ cladding layer 22 of 2.3 μm thickness, an n-type GaN guide layer 23 of 0.02 μm thickness, an active multi-quantum-well layer 24 including InGaN well layers each of 5.5 nm thickness and GaN barrier layers each of 8 nm thickness, a GaN protection layer 25 of 70 nm thickness, a p-type $Al_{0.3}Ga_{0.7}N$ current block layer 26 of 20 nm thickness, a p-type $Al_{0.05}Ga_{0.95}N$ cladding layer 27 of 0.5 μm thickness, and a p-type GaN contact layer 28 of 0.1 μm thickness.

Note that the thickness and mix crystal ratio of these compound semiconductor layers can be adjusted as appropriate and are not related to the essence of the present invention. Furthermore, the wavelength of laser light emitted from nitride semiconductor laser device 10 can be adjusted as appropriate, e.g., in a range of 370 nm-470 nm by adjusting the mix crystal ratio of active multi-quantum-well layer 24. The present embodiment is adjusted to emit laser light having a wavelength of 405 nm. Furthermore, active multi-quantum-well layer 24 may contain at least one kind of group 5 elements such as As or P at a concentration of at least 0.01 atomic % and at most 10 atomic %.

Cladding layer 27 and p-type contact layer 28 in semiconductor laser device 10 are processed to form a ridged stripe portion 13 in a stripe form extending in the length direction of the cavity. Here, ridged stripe portion 13 has a stripe width of approximately 1.2 to 2.4 μm, for example, and typically approximately 1.5 μm. The present invention is also applicable to a broad area type of semiconductor laser device having a stripe width of tens μm for an illumination use. Formed on the top surface of p-type contact layer 28 is a p-electrode 14 including an Mo layer and an Al layer stacked in this order. An insulation film 12 including a $SiO_2$ layer and a $TiO_2$ layer stacked in this order is provided on either side of ridged stripe portion 13 and under p-electrode 14. Furthermore, semiconductor substrate 11 has its bottom surface provided with an n-electrode 15 including a Hf layer and an Al layer deposited in this order.

Figure 2:
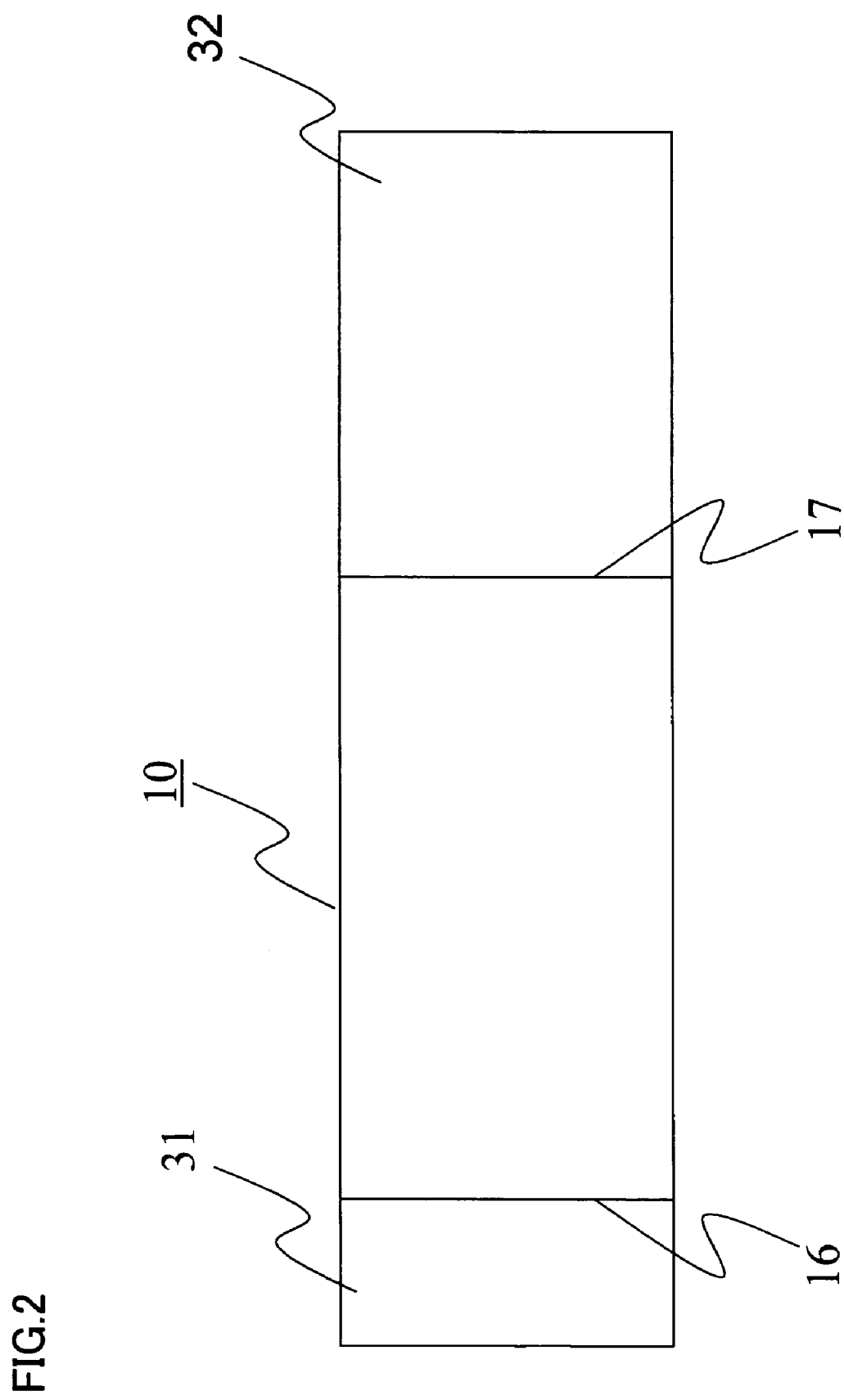
FIG. 2 is a schematic side view of the semiconductor laser device of FIG. 1, along its cavity length direction.

FIG. 2 schematically shows a side surface of the FIG. 1 semiconductor laser device along the length direction of its cavity. A light-reflecting end face 17 and a light-emitting end face 16 of semiconductor laser device 10 can be formed by cleavage for example with a method of scribing with a diamond point and then breaking the wafer that includes the elements up to p-electrode 14 and n-electrode 15 formed as described above. The cleft surfaces serve as mutually parallel end faces 16 and 17 shown in FIG. 2.

An aluminum oxide ($Al_2O_3$) film 31 of 281.3 nm thickness is formed on light-emitting end face 16 and its reflectance is 5.6%. The $Al_2O_3$ film has a refraction index of 1.680, and if this value increases by 0.01 to 1.690, then the reflectance decreases to 4.9%. Furthermore, the thickness of 281.3 nm is larger than $\lambda/n=405/1.680=241$ nm. In other words, when the thickness is denoted by d, the refraction index is denoted by n for lasing wavelength $\lambda$ and the reflectance denoted by R (d, n) regarding the $Al_2O_3$ film, thickness d satisfies conditions of R (d, n)>R (d, n+0.01) and d>$\lambda$/n. For the sake of comparison, on the other hand, a coating film having a conventional thickness of 80.3 nm has also been examined. With this thickness, if the refraction index increases by 0.01, the reflectance increases from 5.6% to 5.9%.

In other words, the laser device including the 281.3 nm thick coating film corresponds to the aforementioned sample (2) and the laser device including the 80.3 nm thick coating film corresponds to the aforementioned sample (1). Hereinafter, therefore, a laser device as an embodiment of the present invention will also be referred to as sample (2) and one as a comparative example will also be referred to as sample (1).

A highly reflecting film 32 having a reflectance of at least 95% is formed on light-reflecting end face 17. Highly reflecting film 32 includes four stacked pairs of a 71 nm thick silicon oxide ($SiO_2$) film and a 46 nm thick titanium oxide ($TiO_2$) film (the $SiO_2$ film first deposited), and a 142 nm thick $SiO_2$ film further deposited on the outermost surface thereof.

$Al_2O_3$ film 31 and highly reflecting film 32 can be formed for example by electron cyclotron resonance (ECR) sputtering. Alternatively, they can also be formed by any of other various sputtering techniques, an electron beam (EB) evaporation method, a chemical vapor deposition (CVD) method, or the like.

After formation of coating films 31, 32 for reflection as described above, the wafer is divided into chips to obtain semiconductor laser devices.

Aging tests were conducted on the nitride semiconductor laser devices thus obtained, under conditions of pulsed driving (a width of 30 ns and a duty ratio of 50%) and generation of a constant optical output of 210 mW at an ambient temperature of 80° C. Results thereof are shown in the graph of FIG. 5 as described previously. As shown in the graph, the semiconductor laser device in the embodiment of the present invention (sample (2)) can suppress increase in its driving-current, as compared to the exemplary conventional semiconductor laser device (sample (1)).

According to the present invention, therefore, it is possible by adjusting the thickness of the coating film at the light-emitting portion to suppress increase in current during driving of the semiconductor laser and thus possible to provide the semiconductor laser device having its improved lifetime.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor laser device including a coating film formed at a light-emitting portion of the semiconductor laser device, wherein said coating film has a thickness d and a refraction index n for a lasing wavelength $\lambda$ so that the inequality $d > \lambda/n$ is satisfied and so that a reflectance of the coating film at said light-emitting portion is greater than a reflectance of a coating film having a thickness d and a refraction index n+0.01.

2. The semiconductor laser device according to claim 1, wherein said coating film is one of oxide, nitride and oxynitride.

3. The semiconductor laser device according to claim 2, wherein said coating film is one of $SiO_2$, $Al_2O_3$, and $AlO_xN_y$, where x>0 and y>0.

4. The semiconductor laser device according to claim 1, wherein an additional $AlO_xN_y$ layer, where x>0 and y>0, is interposed between said coating film and said semiconductor.

5. The semiconductor laser device according to claim 1, wherein nitride semiconductor is used to form the semiconductor laser device and said lasing wavelength $\lambda$ is in a range of 390 nm to 470 nm.

* * * * *